(12) United States Patent
Eneman et al.

(10) Patent No.: US 9,006,705 B2
(45) Date of Patent: Apr. 14, 2015

(54) DEVICE WITH STRAINED LAYER FOR QUANTUM WELL CONFINEMENT AND METHOD FOR MANUFACTURING THEREOF

(71) Applicants: IMEC, Leuven (BE); GLOBALFOUNDRIES Inc., Grand Cayman, KY (US)

(72) Inventors: Geert Eneman, Balen (BE); David Brunco, Hillsboro, CA (US); Geert Hellings, Heverlee (BE)

(73) Assignees: IMEC, Leuven (BE); GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/914,514

(22) Filed: Jun. 10, 2013

(65) Prior Publication Data

US 2014/0054547 A1 Feb. 27, 2014

Related U.S. Application Data

(60) Provisional application No. 61/693,123, filed on Aug. 24, 2012.

(51) Int. Cl.
*H01L 29/06* (2006.01)
*H01L 29/78* (2006.01)
*H01L 29/775* (2006.01)
(Continued)

(52) U.S. Cl.
CPC ............ *H01L 29/785* (2013.01); *H01L 29/775* (2013.01); *H01L 29/7781* (2013.01); *H01L 29/161* (2013.01); *H01L 29/165* (2013.01); *H01L 29/1054* (2013.01); *B82Y 10/00* (2013.01)

(58) Field of Classification Search
CPC ............ H01L 29/7378; H01L 29/1054; H01L 29/7782
USPC ......... 257/9, 14, E33.008, E29.069, E29.248; 438/962
See application file for complete search history.

(56) References Cited

U.S. PATENT DOCUMENTS 7,393,735 B2 * 7/2008 Chu et al. .................. 438/172
7,728,387 B1 6/2010 Krishnamohan et al.
(Continued)

OTHER PUBLICATIONS

Eneman et. al., "Stress Simulations for Optimal Mobility Group IV p- and nMMOS FinFETs for the 14 nm Node and Beyond," IEEE International Electron Device Meeting, pp. 131-134, 2012.
(Continued)

*Primary Examiner* — Jarrett Stark
*Assistant Examiner* — Shahed Ahmed
(74) *Attorney, Agent, or Firm* — Knobbe, Martens, Olson & Bear LLP

(57) ABSTRACT

The disclosed technology relates to transistors having a strained quantum well for carrier confinement, and a method for manufacturing thereof. In one aspect, a FinFET or a planar FET device comprises a semiconductor substrate, a strain-relaxed buffer layer comprising Ge formed on the semiconductor substrate, a channel layer formed on the strain-relaxed buffer layer, and a strained quantum barrier layer comprising SiGe interposed between and in contact with the strain-relaxed buffer layer and the channel layer. The compositions of the strain-relaxed buffer layer, the strained quantum barrier layer and the channel layer are chosen such that a band offset of the channel layer and a band offset of the strained quantum barrier layer have opposite signs with respect to the strain-relaxed buffer layer.

15 Claims, 9 Drawing Sheets

(51) Int. Cl.
*H01L 29/778* (2006.01)
*H01L 29/161* (2006.01)
*H01L 29/165* (2006.01)
*H01L 29/10* (2006.01)
*B82Y 10/00* (2011.01)

(56) References Cited

U.S. PATENT DOCUMENTS

| | | |
|---|---|---|
| 2002/0011628 A1 | 1/2002 | Takagi |
| 2004/0227154 A1* | 11/2004 | Chu et al. ............... 257/194 |
| 2004/0227158 A1* | 11/2004 | Delhougne et al. ........ 257/202 |
| 2006/0292776 A1 | 12/2006 | Jin et al. |
| 2007/0105251 A1* | 5/2007 | Liu et al. ............... 438/22 |
| 2007/0205444 A1 | 9/2007 | Luo et al. |
| 2008/0237572 A1 | 10/2008 | Chui et al. |
| 2010/0187496 A1* | 7/2010 | Yan ........................ 257/13 |
| 2011/0156005 A1 | 6/2011 | Pillarisetty et al. |
| 2014/0054548 A1* | 2/2014 | Pillarisetty et al. ......... 257/24 |

OTHER PUBLICATIONS

Galdin et al., "Band offset predictions for strained group IV alloys: Si1-x-yGexCy on Si(001) and Si1-xGex on Si1-zGez(001)," Semicond. Sci. Technol. 15, pp. 565-572, 2000.

Van De Walle et al., "Band lineups and deformation potentials in the model-solid theory," Physical Review B, vol. 39, No. 3, pp. 1871-1883, 1989.

* cited by examiner

DEVICE WITH STRAINED LAYER FOR QUANTUM WELL CONFINEMENT AND METHOD FOR MANUFACTURING THEREOF

CROSS-REFERENCE TO RELATED APPLICATIONS

This application claims priority under 35 U.S.C. §119(e) to U.S. provisional patent application 61/693,123 filed on Aug. 24, 2012, which application is hereby incorporated by reference in its entirety.

BACKGROUND OF THE INVENTION

1. Field of the Invention

The disclosed technology relates to semiconductor devices generally, and relates more in particular to transistors having a strained quantum well for carrier confinement, and a method for manufacturing thereof.

2. Description of the Related Technology

Performance enhancement of FinFETs and planar FET devices can be achieved using a number of approaches. One approach includes replacing the traditional channel material (Si) with another material to create a heterostructure. Another approach includes inducing stress in the channel to enhance carrier mobility.

However, some of these approaches can have drawbacks, such as increased junction leakage and deteriorated short-channel effects.

SUMMARY OF CERTAIN INVENTIVE ASPECTS

In one aspect, a FinFET device comprises a semiconductor substrate, a strain-relaxed buffer layer comprising Ge formed on the semiconductor substrate, a channel layer formed on the strain-relaxed buffer layer, and a strained quantum barrier layer comprising SiGe interposed between and in contact with the strain-relaxed buffer layer and the channel layer. The compositions of the strain-relaxed buffer layer, the strained quantum barrier layer and the channel layer are chosen such that a band offset of the channel layer and a band offset of the strained quantum barrier layer have opposite signs with respect to the strain-relaxed buffer layer. The resulting conduction band structure of the FinFET device comprises an electron-confining quantum well in an n-type FinFET device and the resulting valence band structure of the FinFET device comprises a hole-confining quantum well in a p-type FinFET device.

In another aspect, a planar FET device comprises a semiconductor substrate, a strain-relaxed buffer layer comprising Ge formed on the semiconductor substrate, a channel layer formed on the strain-relaxed buffer layer, and a strained quantum barrier layer comprising SiGe interposed between and in contact with the strain-relaxed buffer layer and the channel layer. The compositions of the strain-relaxed buffer layer, the strained quantum barrier layer and the channel layer are chosen such that a band offset of the channel layer and a band offset of the strained quantum barrier layer have opposite signs with respect to the strain-relaxed buffer layer. The resulting conduction band structure of the planar FET device comprises an electron-confining quantum well in an n-type planar FET device and the resulting valence band structure of the planar FET device comprises a hole-confining quantum well in a p-type planar FET device.

BRIEF DESCRIPTION OF THE DRAWINGS

All drawings are intended to illustrate some aspects and embodiments of the present disclosure. The drawings described are only schematic and are non-limiting.

DETAILED DESCRIPTION OF CERTAIN ILLUSTRATIVE EMBODIMENTS

Figure 1A:
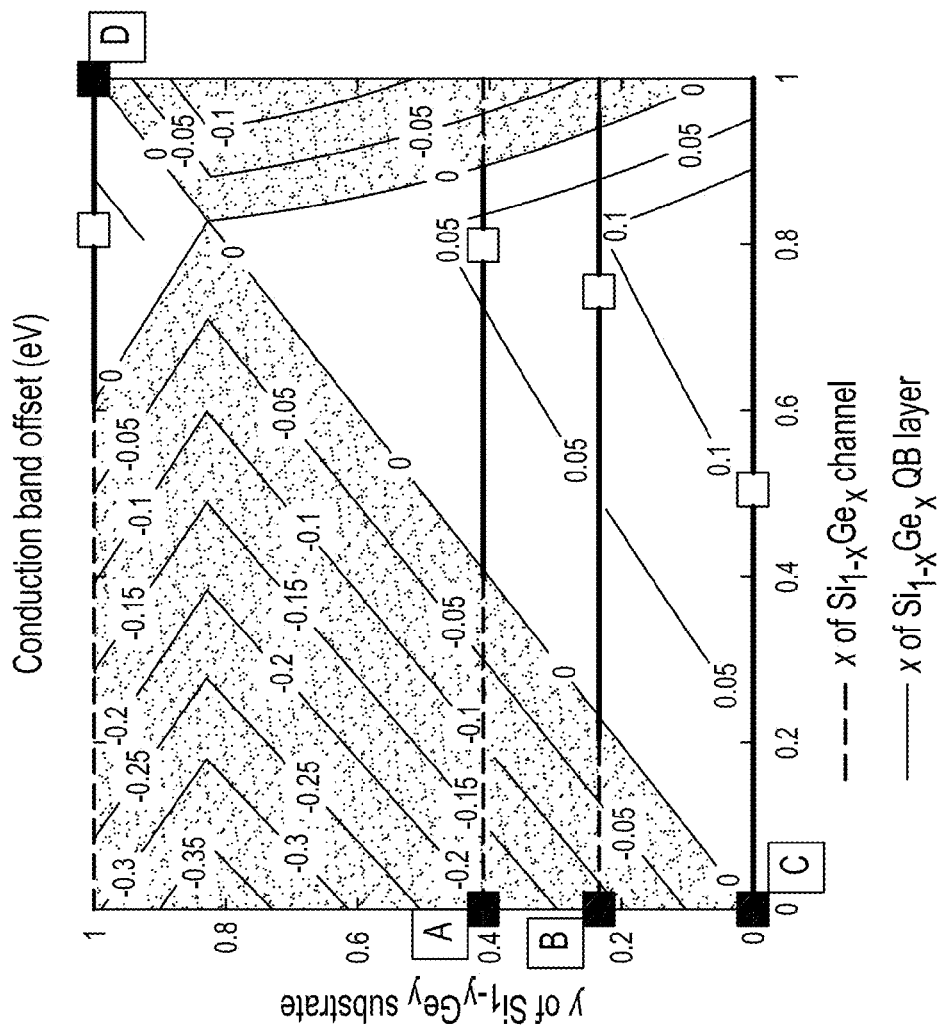
FIG. 1A illustrates a diagram representing a calculation of lines of equal conduction band offset for the different compositions of the SRB layer (or the substrate) and the channel layer (dark lines on grey area) and lines of equal conduction band offset for the different compositions of the SRB layer (or the substrate) and the strained quantum barrier (QB) layer (dark lines on white area) for a FinFET device.

The disclosed technology relates to a device with strained layer for quantum well confinement and a method for manufacturing thereof. The device of the disclosure has improved performance for the 10 nm-node FinFETs.

In a traditional layer stack where the channel is directly grown on top of an SRB, both the channel stress (determining the channel mobility) and the band offset between channel and the underlying layers (determining the electrostatic control of the MOSFET) is determined by the channel and SRB composition. One drawback of this approach is that higher strain is beneficial both for high mobility and band offset, but too high strain leads to defect formation and relaxation.

The device of the disclosure solves at least the above mentioned problem and allows increasing the band offset without increasing the strain to a level which can lead to defect formation and relaxation in the channel. By introducing a quantum barrier layer as disclosed in the present disclosure both parameters are decoupled: the channel stress is determined by the composition choice for the channel and the strain-relaxed buffer (SRB), whereas the band offset between channel and the underlying layers is determined by the composition choice for the channel and the quantum barrier layer. This stack therefore allows separate optimization of channel stress and band offset.

Whereas scaling bulk silicon FinFETs demands ever increasing doping levels in the ground-plane, the use of heterojunctions provides an alternative to improve electrostatics. Indeed, simulations indicate that band offsets of 200 meV are sufficient to improve drain-induced barrier lowering (DIBL) and subthreshold slope significantly for 10 nm-node FinFETs, with little further improvement for larger band offsets.

In a first aspect of the disclosed technology, a FinFET device comprises a semiconductor substrate, a strain-relaxed buffer (SRB) layer comprising Ge formed on the semiconductor substrate, a channel layer formed on the strain-relaxed buffer layer, and a strained quantum barrier (SQB) layer comprising SiGe interposed between and in contact with the strain-relaxed buffer layer and the channel layer. The compositions of the strain-relaxed buffer layer, the strained quantum barrier layer and the channel layer are chosen such that a band offset of the channel layer and a band offset of the strained quantum barrier layer have opposite signs with respect to the strain-relaxed buffer layer. The resulting conduction band structure of the FinFET device comprises an electron-confining quantum well in an n-type FinFET device and the resulting valence band structure of the FinFET device comprises a hole-confining quantum well in a p-type FinFET device.

The conduction and valence band offsets for SiGe heterostructures were calculated using a model briefly described below.

First, the strain tensor is calculated along the <011> direction on a (100) wafer, per standard transistor orientation. For wide, planar FETs, a strained channel on an SRB is under biaxial stress, while for FinFETs, the stress is effectively uniaxial. The strain tensor $\epsilon'$ is then rotated to $\epsilon$ along the semiconductor's principal axes. From $\epsilon$, the bands for the channel and SRB are calculated with parameters from Van De Walle et al., *Phys. Rev. B*39, 1871 (1989) and Galdin et al, *Semicond. Sci. Technol.* 15, 565 (2000) for $Si_{1-x}Ge_x$.

A quantum well for nFETs includes a negative conduction band offset $\Delta E_C = E_{C,channel} - E_{C,SRB}$, while a quantum well for pFETs includes a positive valence band offset $\Delta E_V = E_{V,channel} - E_{V,SRB}$. The effect of strain on the conduction band energy is calculated through deformation potential theory, including the $\Delta$ and L bands for $Si_{1-x}Ge_x$. The valence band structure is calculated by 6-band k.p (k dot p) theory for all semiconductors, using parameters from Van De Walle et al., *Phys. Rev. B* 39, 1871 (1989). Deformation potentials are linearly interpolated for alloys. For an optimized gate stack (CET of 0.7 nm), work functions are estimated assuming a $V_T$ target of +0.2 and −0.2 V for respectively n- and pFETs.

FIG. 1A represents the lines of equal conduction band offset for different compositions of the SRB layer (or the substrate) $Si_{1-y}Ge_y$ and the channel layer $Si_{1-x}Ge_x$ (dark lines on grey area) and the lines of equal conduction band offset for the different compositions of the SRB layer (or the substrate) $Si_{1-y}Ge_y$ and the strained quantum barrier (QB) layer (dark lines on white area) $Si_{1-x}Ge_x$ for a FinFET device. In the descriptions that follow, an alloy of Si and Ge may be denoted as SiGeX %, where X represents the percentage of Ge in the alloy.

Figure 1B:
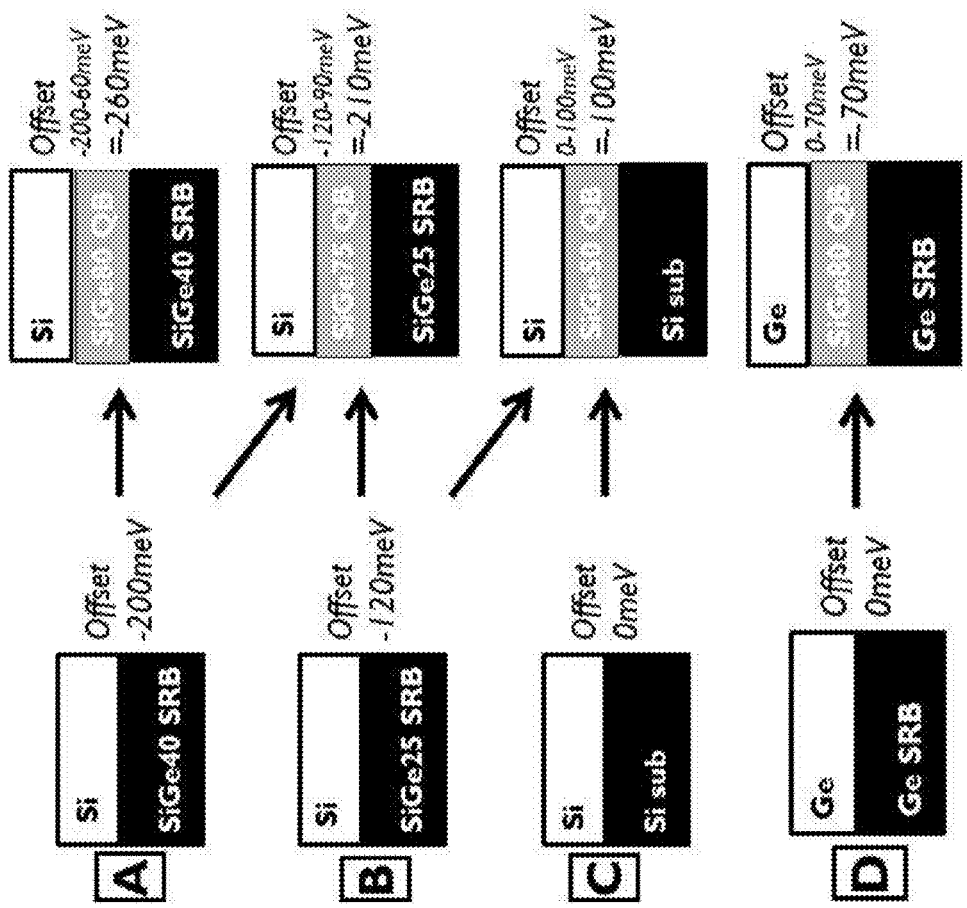
FIG. 1B schematically illustrates, on the left, stacks comprising a channel layer on a SRB or a substrate corresponding to full squares denoted by A, B, C, D in FIG. 1A. In addition, FIG. 1B schematically illustrates, on the right, stacks comprising a strained quantum barrier (SQB or QB) layer interposed between a channel layer and a SRB or a substrate corresponding to open squares in FIG. 1A, where the SQB or QB is configured to introduce an additional conduction band offset between the channel and the underlying layers, according to embodiments of the disclosed technology.

FIG. 1B schematically illustrates, on the left, stacks comprising a channel layer on a SRB or a substrate corresponding to full squares denoted by A, B, C, D in FIG. 1A. In addition, FIG. 1B schematically illustrates, on the right, stacks comprising a strained quantum barrier (SQB or QB) layer interposed between a channel layer and a SRB or a substrate corresponding to open squares in FIG. 1A, where the SQB or QB is configured to introduce an additional conduction band offset between the channel and the underlying layers, according to embodiments of the disclosed technology.

From FIG. 1B several examples can be summarized:
(i) enhanced conduction band offset of about −260 meV including about −200 meV attributable to the initial stack (Si channel on SiGe40% SRB) and an additional offset of about −60 meV introduced by the strained quantum barrier layer. The final stack includes a SRB SiGe40%, a QB layer comprising SiGe80%, and a channel layer comprising Si.
(ii) enhanced conduction band offset of about −210 meV including about −120 meV attributable to the initial stack (Si channel on SiGe25% SRB) and an additional offset of about −90 meV introduced by the strained quantum barrier layer. The final stack includes a SRB comprising SiGe25%, a QB layer comprising SiGe75%, and a channel layer comprising Si.
(iii) enhanced conduction band offset of about −100 meV including about 0 meV attributable to the initial stack (Si channel on Si substrate) and an additional off set of about −100 meV introduced by the strained quantum barrier layer. The final stack includes a Si substrate, a QB layer comprising SiGe50%, and a channel layer comprising Si.
(iv) enhanced conduction band offset of about −70 meV including about 0 meV attributable to the initial stack (Ge channel on Ge SRB) and an additional offset of about −70 meV introduced by the strained quantum barrier layer. The final stack includes a SRB comprising Ge, a QB layer comprising SiGe80%, and a channel layer comprising Ge.

Figure 2A:
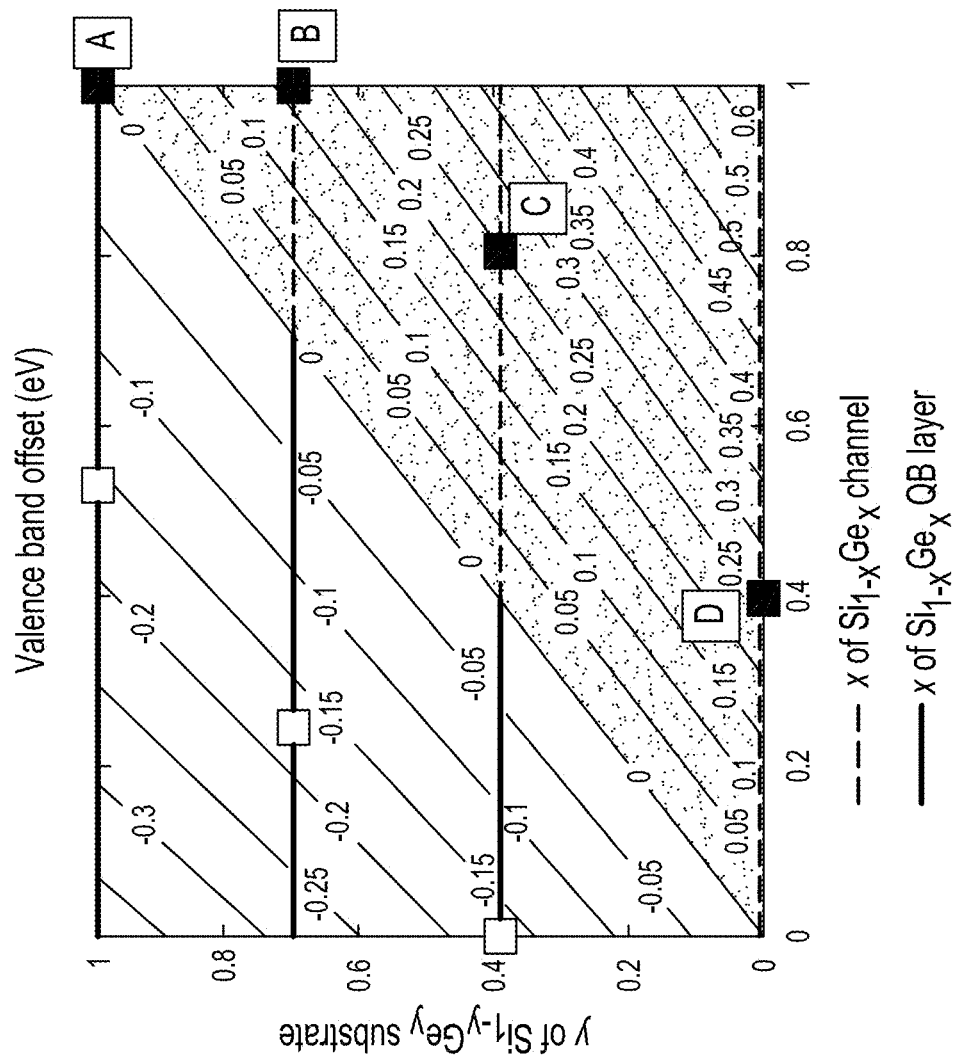
FIG. 2A illustrates a diagram representing a calculation of lines of equal valence band offset for the different compositions of the SRB layer (or the substrate) and the channel layer (dark lines on grey area) and lines of equal valence band offset for the different compositions of the SRB layer (or the substrate) and the strained quantum barrier (QB) layer (dark lines on white area) for a FinFET device.

FIG. 2A represents the lines of equal valence band offset for the different compositions of the SRB layer (or the substrate) $Si_{1-y}Ge_y$ and the channel layer $Si_{1-x}Ge_x$ (dark lines on grey area) and the lines of equal valence band offset for the different compositions of the SRB layer (or the substrate) $Si_{1-y}Ge_y$ and the strained quantum barrier (QB) layer $Si_{1-x}Ge_x$ (dark lines on white area) for a FinFET device.

Figure 2B:
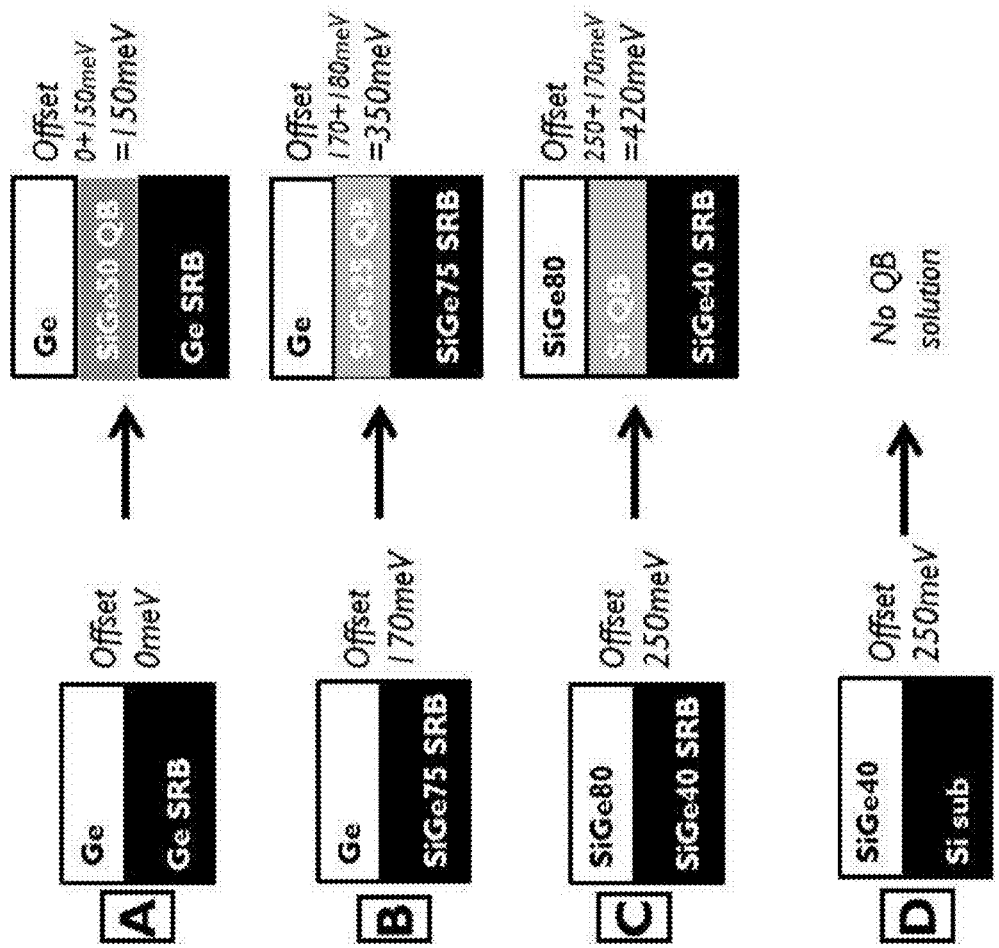
FIG. 2B schematically illustrates, on the left, stacks comprising a channel layer on a SRB or a substrate corresponding to full squares denoted by A, B, C, D in FIG. 2A. In addition, FIG. 1B schematically illustrates, on the right, stacks comprising a strained quantum barrier (SQB or QB) layer interposed between a channel layer and a SRB or a substrate corresponding to open squares in FIG. 2A, where the SQB or QB is configured to introduce an additional conduction band offset between the channel and the underlying layers, according to embodiments of the disclosed technology.

FIG. 2B schematically illustrates, on the left, stacks comprising a channel layer on a SRB or a substrate corresponding to full squares denoted by A, B, C, D in FIG. 1A. In addition, FIG. 2B schematically illustrates, on the right, stacks comprising a strained quantum barrier (SQB or QB) layer interposed between a channel layer and a SRB or a substrate corresponding to open squares in FIG. 2A, where the SQB or QB is configured to introduce an additional conduction band offset between the channel and the underlying layers, according to embodiments of the disclosed technology.

From FIG. 2B several examples can be summarized:
(i) enhanced valence band offset of about +150 meV including about 0 meV attributable to the initial stack (Ge channel on Ge SRB) and an additional offset of about +150 meV introduced by the strained quantum barrier layer. The final stack includes a SRB comprising Ge, a QB layer comprising SiGe50, and a channel layer comprising Ge.
(ii) enhanced valence band offset of about +350 meV including about +170 meV attributable to the initial stack (Ge channel on SiGe75% SRB) and about +180 meV introduced by the strained quantum barrier layer. The final stack includes a SRB comprising SiGe75%, a QB layer comprising SiGe25%, and a channel layer comprising Ge.
(iii) enhanced valence band offset of about +420 meV including about +250 meV attributable to the initial stack (SiGe80% channel on SiGe40% SRB) and an additional offset of about +170 meV introduced by the strained quantum barrier layer. The final stack includes a SRB comprising SiGe40%, a QB layer comprising Si, and a channel layer comprising SiGe80%.
(iv) this example corresponds to a situation wherein according to the model no QB solution is available for the initial stack (SiGe40% channel on Si substrate) with a valence band offset of about +250 meV.

In embodiments of the first aspect the semiconductor substrate comprises/consist of a group IV semiconductor material.

In different embodiments of the first aspect the strain-relaxed buffer layer comprises Ge and the strained quantum barrier layer comprising SiGe.

Further in embodiments of the first aspect the channel of the FinFET device comprises Ge.

In a first example wherein the device is a n-type FinFET and the channel layer comprises Ge, the compositions of the strain-relaxed buffer layer, the strained quantum barrier layer and the channel layer are chosen such that between the strained quantum barrier layer and the channel layer there is a lattice constant mismatch of at least about 0.4%.

The device of the first example and the manufacturing thereof is described in detail further. It is an advantage of the method of the disclosure that the whole stack, i.e. the SRB, the SQB and the channel layer can be grown in-situ, in one process step.

In a second example wherein the device is a p-type FinFET and the channel layer comprises Ge, the compositions of the strain-relaxed buffer layer, the strained quantum barrier layer and the channel layer are chosen such that the strained quantum barrier layer comprises a lower amount of Ge than the strain relaxed buffer. Preferably, the strained quantum barrier layer comprises 10% to 70% less Ge than the strain-relaxed buffer. Preferably the strained quantum barrier layer comprises at least 10% less Ge than the strain-relaxed buffer in order to achieve the quantum well effect. At maximum the strained quantum barrier layer comprises about 70% less Ge to achieve the quantum well effect and without introducing defects due to lattice mismatch.

Further in embodiments of the first aspect related to the first or the second example, at least one of the strain-relaxed buffer layer and the channel layer may further comprise Si. Thus, at least one or both the SRB layer and the channel layer comprise SiGe. Preferably, at least one or both the SRB layer and the channel layer consist of SiGe.

Alternatively, in embodiments of the first aspect related to the first or the second example, at least one of the strain-relaxed buffer layer and the channel layer may further comprise Sn. Thus, at least one or both the SRB layer and the channel layer comprise GeSn. Preferably, at least one or both the SRB layer and the channel layer consist of GeSn.

Furthermore, in other embodiments of the first aspect wherein the strain-relaxed buffer layer comprises Ge and the strained quantum barrier layer comprising SiGe, the channel of the FinFET device comprises Si.

In a third example of the first aspect wherein the device is a n-type FinFET and the channel layer comprises Si, the compositions of the strain-relaxed buffer layer, the strained quantum barrier layer and the channel layer are chosen such that the strained quantum barrier layer comprises a higher amount of Ge than the strain-relaxed buffer. Preferably, the strained quantum barrier layer comprises about 10% to about 70% more Ge than the strain-relaxed buffer. Preferably, the strained quantum barrier layer comprises at least about 10% more Ge than the strain-relaxed buffer in order to achieve the quantum well effect. At maximum, the strained quantum barrier layer comprises about 70% more Ge to achieve the quantum well effect without introducing defects due to lattice mismatch.

In different embodiments of the first aspect related to the first, second or third example, the strained quantum barrier layer which is part of the FinFET device has a thickness from about 3 nm to about 30 nm, more preferably between about 5 nm and about 20 nm.

n a second aspect of the disclosed technology, a planar FET device comprises a semiconductor substrate, a strain-relaxed buffer layer comprising Ge formed on the semiconductor substrate, a channel layer formed on the strain-relaxed buffer layer, and a strained quantum barrier layer comprising SiGe interposed between and in contact with the strain-relaxed buffer layer and the channel layer. The compositions of the strain-relaxed buffer layer, the strained quantum barrier layer and the channel layer are chosen such that a band offset of the channel layer and a band offset of the strained quantum barrier layer have opposite signs with respect to the strain-relaxed buffer layer. The resulting conduction band structure of the planar FET device comprises an electron-confining quantum well in an n-type planar FET device and the resulting valence band structure of the planar FET device comprises a hole-confining quantum well in a p-type planar FET device.

In a second aspect of the disclosure a planar FET device is disclosed comprising: a semiconductor substrate, a strain-relaxed buffer (SRB) layer, a strained quantum barrier layer (SQB) and a channel layer, wherein the strained quantum barrier layer is positioned in between the strain relaxed buffer layer and the channel layer and in physical contact with both, and wherein the compositions of the strain-relaxed buffer layer, the strained quantum barrier layer and the channel layer are chosen such that a band offset of the channel layer and a band offset of the strained quantum barrier layer with respect to the strain-relaxed buffer layer are of opposite signs thereby creating a quantum well effect in a conduction band structure by creating a conduction band offset between the channel and the quantum barrier layer for a n-type FET device and, respectively, in a valence band structure by creating a valence band offset between the channel and the quantum barrier layer for a p-type FET device, thereby improving carrier confinement in the channel. Both the strained quantum barrier layer and the channel layer are strained with respect to the strain relaxed buffer.

In embodiments of the second aspect the semiconductor substrate comprises/consist of a group IV semiconductor material.

In embodiments of the second aspect the strain-relaxed buffer layer comprises Ge and the strained quantum barrier layer comprising SiGe. Further, in embodiments of the second aspect the channel layer comprises Ge.

Figure 3:
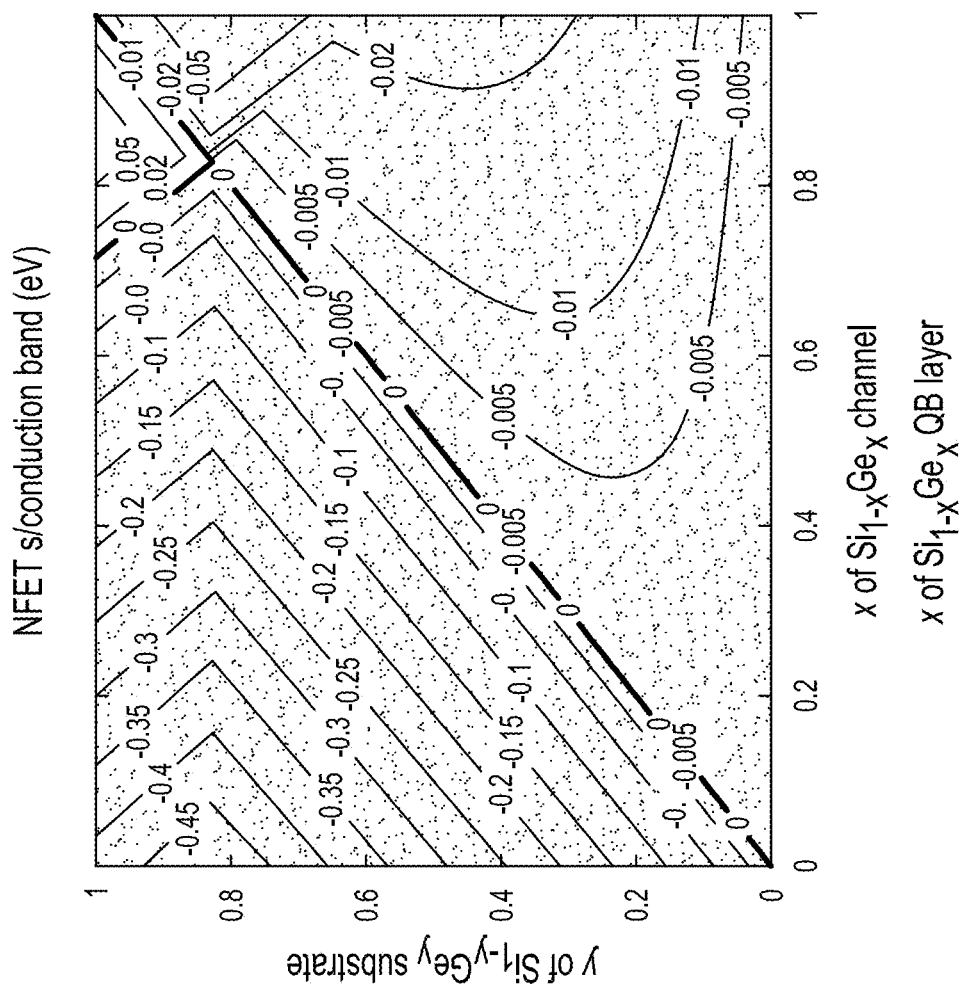
FIG. 3 illustrates a diagram representing a calculation of lines of equal conduction band offset for the different compositions of the SRB layer (or the substrate) and the channel layer (dark lines on grey area) and lines of equal conduction band offset for the different compositions of the SRB layer (or the substrate) and the strained quantum barrier (QB) layer (dark lines on white area) for a planar nFET device.

FIG. 3 represents the lines of equal conduction band offset for the different compositions of the SRB layer (or the substrate) $Si_{1-y}Ge_y$ and the channel layer $Si_{1-x}Ge_x$ (dark lines on grey area) and the lines of equal conduction band offset for the different compositions of the SRB layer (or the substrate) $Si_{1-y}Ge_y$ and the strained quantum barrier (QB) layer $Si_{1-x}Ge_x$ (dark lines on white area) for a planar nFET device.

In a fourth example of the second aspect the device is a n-type planar FET and the compositions of the strain-relaxed buffer layer, the strained quantum barrier layer and the channel layer are chosen such that between the strained quantum barrier layer and the channel layer there is a lattice constant mismatch of at least about 0.4%.

Further in embodiments of the second aspect related to the fourth example, at least one of the strain-relaxed buffer layers and the channel layer may further comprise Si. Thus, at least one or both the SRB layer and the channel layer comprise SiGe. Thus, at least one or both the SRB layer and the channel layer consist of SiGe.

Yet further in other embodiments of the second aspect related to the fourth example, at least one of the strain-relaxed buffer layers and the channel layer may further comprise Sn. Thus, at least one or both the SRB layer and the channel layer comprise GeSn. Thus, at least one or both the SRB layer and the channel layer consist of GeSn.

The device of the fourth example and the manufacturing thereof is discussed in detail further.

Figure 4:
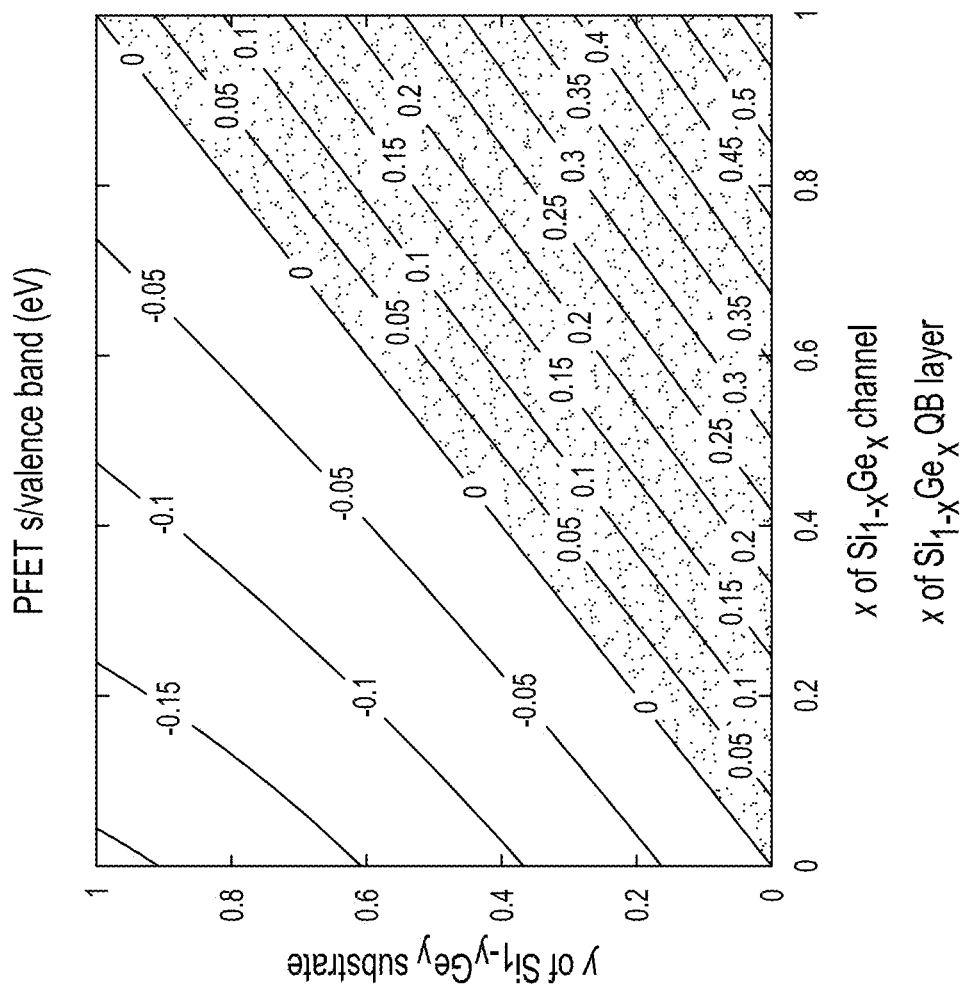
FIG. 4. represents a diagram representing a calculation of lines of equal valence band offset for the different compositions of the SRB layer (or the substrate) and the channel layer (grey area) and lines of equal valence band offset for the different compositions of the SRB layer (or the substrate) and the strained quantum barrier (QB) layer (white area) for a planar pFET device.

FIG. 4 represents the lines of equal valence band offset for the different compositions of the SRB layer (or the substrate) $Si_{1-y}Ge_y$ and the channel layer $Si_{1-x}Ge_x$ (dark lines on grey area) and the lines of equal valence band offset for the different compositions of the SRB layer (or the substrate) $Si_{1-y}Ge_y$ and the strained quantum barrier (QB) layer $Si_{1-x}Ge_x$ (dark lines on white area) for a planar pFET device.

In a fifth example of the second aspect the device is a p-type planar FET and the compositions of the strain-relaxed buffer layer, the strained quantum barrier layer and the channel layer are chosen such that the strained quantum barrier layer comprises a lower amount of Ge than the strain relaxed buffer. Preferably, the strained quantum barrier layer comprises about 10% to about 70% less Ge than the strain-relaxed buffer. Preferably, the strained quantum barrier layer comprises at least about 10% less Ge than the strain-relaxed buffer in order to achieve the quantum well effect. At maximum, the strained quantum barrier layer comprises about 70% less Ge to achieve the quantum well effect without introducing defects due to lattice mismatch.

In different embodiments of the second aspect related to the fourth or the fifth example, the strained quantum barrier layer which is part of the planar FET device has a thickness from 3 nm to 30 nm, more preferably between 5 nm and 20 nm.

Figure 5:
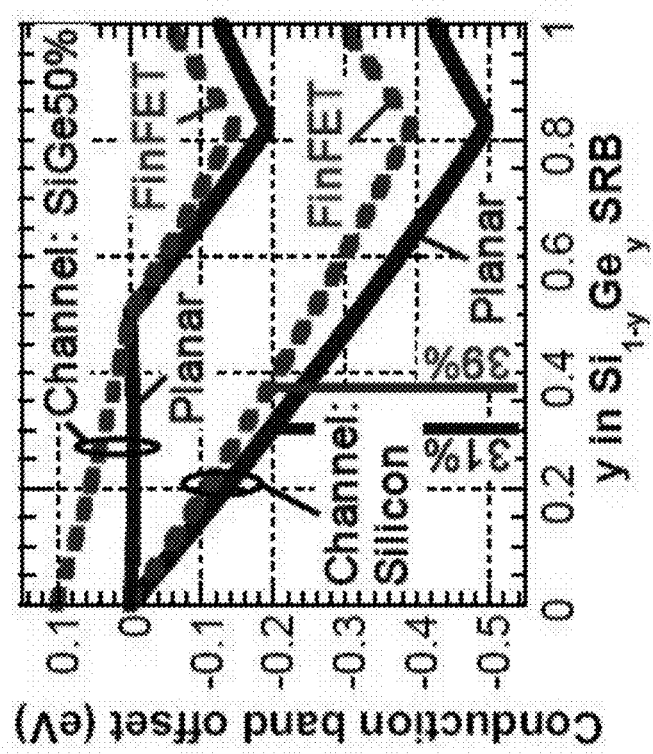
FIG. 5. shows the conduction band offset between channel and SRB versus Ge % in the SRB for Si and SiGe50% channels.
Figure 6:
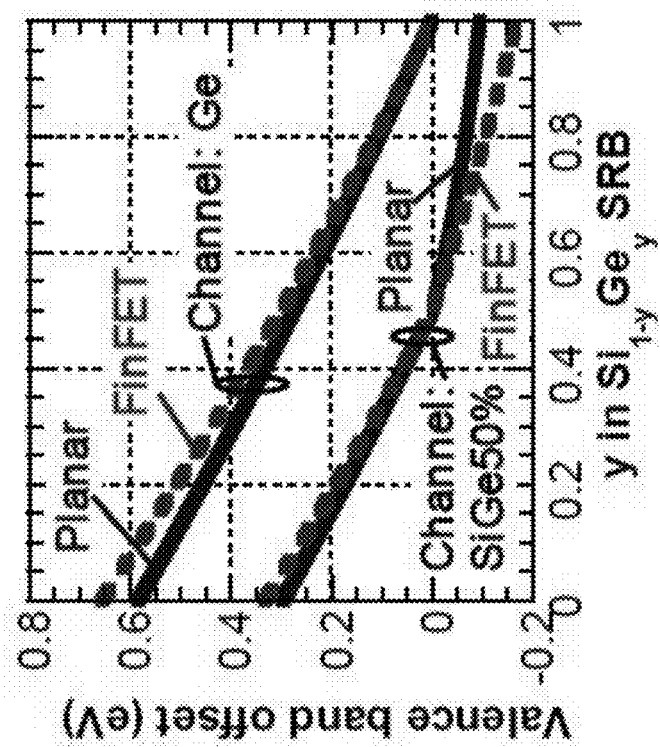
FIG. 6 shows the valence band offset between channel and SRB versus Ge % in the SRB for Ge and SiGe50% channels.

Offsets are 25% lower for nFinFETs than for planar nFETs (as shown in FIG. 5), e.g., an approximately −200 meV offset in a strained-Si nFET is compatible with an SRB having about 31% Ge for planar vs. about 39% Ge for fins. For Ge channel pFETs, ΔEV is about 10% higher for fins than for planar (as shown in FIG. 6).

Certain embodiments of the first and second aspect relate to an nFET device comprising a strained layer for quantum well confinement. Further certain embodiments relate to an nFET device having improved channel mobility and ON-current and/or lower leakage than the state of the art devices.

In specific embodiments the nFET device comprises a Ge-rich channel and a silicon germanium strained quantum barrier layer.

Certain embodiments relate to a method of manufacturing for an nFET device comprising a strained layer for quantum well confinement.

Several options are being considered for further nFET performance enhancement. One of them is replacing silicon as channel material in traditional Si nFET with Germanium or Germanium rich SiGe with/without the addition of Sn because of the higher mobility of these materials compared with Si. In an example, a transistor is formed on a stack comprising a thick (about 200 nm) relaxed SiGeSn layer grown on a silicon wafer.

Another option for further nFET performance enhancement is enhancing the mobility by creating a tensile stress in the channel. This is achieved by e.g. forming a GeSn relaxed buffer in between the Si substrate and the channel. The channel may comprise Ge, Ge-rich SiGe or SiGeSn.

However, both options referred to above i.e. the thick relaxed SiGeSn and the strained SiGeSn channel on top of a relaxed GeSn layer have important drawbacks such as: (1) the band gap of the whole structure is small leading to unwanted junction leakage; (2) there is small or no conduction band offset between the channel and the substrate which leads to deteriorated short-channel effects.

Certain embodiments relate to a solution which can solve at least one problem from those mentioned above. A thin, strained quantum barrier (SQB) layer comprising SiGe and positioned just under the channel provides an advantageous conduction band offset, leading to better short-channel effects. Moreover, the SQB layer in one embodiment has an advantageous conduction band offset both for the planar nFETs and n-type FinFET configurations.

Advantageously, the SQB layer has a larger band gap than the underlying strain-relaxed buffer which leads to a decrease of the overall junction leakage.

In one aspect an n-FET transistor is described comprising:
a semiconductor substrate,
a strain-relaxed buffer (SRB) layer comprising Ge,
a strained quantum barrier (SQB) layer comprising SiGe, and
a channel layer comprising Ge,
wherein the strained quantum barrier layer is positioned in between the strain-relaxed buffer layer and the channel layer and in physical contact with both, and
wherein the compositions of the strain-relaxed buffer layer (SRB), the strained quantum barrier layer and the channel layer are chosen such that between the strained quantum barrier layer and the channel layer there is a lattice constant mismatch of at least about 0.4%.

In one embodiment, the semiconductor substrate is silicon.

In one embodiment, each of the strain-relaxed buffer layer and the channel layer has a Ge concentration higher than or equal to about 75 at %. Thus both are either Ge-rich layers or, in specific embodiments, pure Ge layers. A strain-relaxed layer is a layer which is substantially free of mechanical stress and mechanical strain. Depending on the composition of the substrate, the substrate being patterned or non-patterned, the composition of the layer to be grown and the parameters of the growth process such as e.g. growth temperature, a certain thickness is deposited or grown before the relaxation appears (critical thickness). In case of a Ge-rich layer grown on Si substrate the critical thickness is estimated to be less than about 30 nm.

Further, the strain-relaxed buffer layer and/or the channel layer can further comprise Si up to about 25 at %.

In particular embodiments the composition of the SRB layer and the channel can be similar or substantially identical, such as for example in the embodiments wherein both SRB layer and the channel layer comprise SiGe (with Ge>about 75 at %). A SRB layer and channel layer made both of the same material has the advantage of easier manufacturability.

In another embodiment, the strain-relaxed buffer layer and/or the channel layer further comprises Sn. In one embodiment the SRB and/or the channel comprises GeSn or SiGeSn with a Sn concentration lower than about 10 at %.

In an example the SRB comprises GeSn while the channel layer comprises SiGe or GeSn or SiGeSn, each of these compositions having a Ge concentration higher than or equal to about 75 at %. In case of GeSn the concentration of Ge is even higher up to about 90 at %.

In another embodiment, the strained quantum barrier layer is a strained layer for quantum well confinement. The SQB layer in one embodiment comprises SiGe, more preferably comprises SiGe and dopants. The concentration of Ge in the SQB layer is between about 50 at % and about 90 at %. Particularly the Ge concentration may be between about 60 at % to 80 at %, more particularly between about 65 at % and 75 at %. The SQB layer may contain only Si and Ge within the concentration ranges mentioned above, e.g., does not contain any other elements except dopants, which have a typical dopant level concentration (about 1 at %).

Further, the optimum composition of the SQB layer is chosen in function of the composition of the channel layer such that a lattice constant mismatch or about 0.4% (or about 0.03 nm) is introduced between the SQB layer and the channel layer. The lattice constant mismatch is appreciated based on the absolute values of the lattice constants for the different compositions, as known for a corresponding blanket layer in relaxed state.

In examples where the channel layer comprises Ge or SiGe (Ge>about 75 at %) a concentration of about 65 at %-90 at % Ge in the SQB layer is optimal, as it leads to the highest band offset, around 100 mV. As an indicative rule of thumb a difference in Ge concentration of about 10 at % between the Ge concentration of the SRB layer and the Ge concentration of the channel layer (overlying the SRB layer) is considered to be optimal in case the channel layer contains only Ge or SiGe without other elements except dopants.

In examples where the channel layer comprises GeSn (Ge>about 75 at %) and considering the lowering effect that Sn has on the lattice constant, the optimum Ge concentration of the SQB layer underneath is lower, namely from about 50 at % to about 70 at %.

For the band gap of the SiGe SQB layer about 1 eV is predicted, which is significantly higher than the 0.67 eV or lower for the Ge/GeSn layers.

In one embodiment, the thickness of the SQB layer is chosen to be between about 3 nm and 30 nm, such that the SQB layer remain strained and prevent forming defects due to stress relaxation, As known to the skilled in the art, the relaxation behavior of layers grown in trenches (recesses) as in one embodiment is different than in the case of layers deposited on blanket substrates wherein a critical thickness can be estimated more straightforward.

In some embodiments of the disclosure the strain-relaxed buffer layer, the strained quantum barrier layer and possibly the channel layer may comprise dopants at a dopant level concentration of about 1 at %.

Further, the device in one embodiment can comprise elevated source and drain areas comprising germanium or SiGe, wherein SiGe has a Si concentration lower than the Si concentration of the strain-relaxed buffer layer.

In one embodiment, the strain-relaxed buffer layer comprises a plurality of sub-layers. Within the SRB layer or its different sub-layers a gradient in Ge concentration can be introduced at the epitaxial growth, typically from a Si-rich SiGe at the bottom of the SRB layer in contact with the substrate to a Ge-rich SiGe at the interface with the SQB layer.

Figures 7A, 7B:
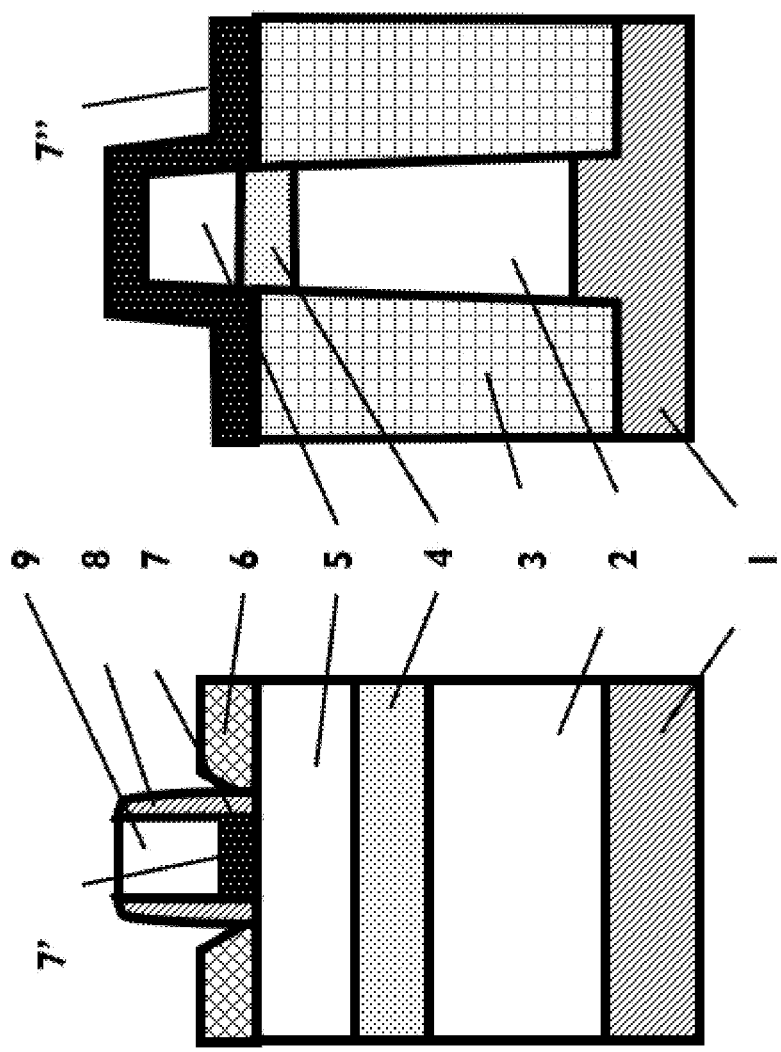
FIG. 7A represents schematically a cross section along the channel of a planar device according to an embodiment of the disclosure.
FIG. 7B represents schematically a cross section across the fin of a FinFET device according to an embodiment of the disclosure.

FIG. 7A represents schematically a cross section along the channel of a planar device according to an embodiment of the disclosure, wherein: (1) substrate; (2) SRB layer; (4) SQB layer; (5) channel layer; (6) elevated S/D; (7') gate metal; (8) spacers; (9) gate fill.

In the examples of the planar configuration the channel layer has a thickness of about 3 nm to 20 nm.

FIG. 7B represents schematically a cross section across the fin of a FinFET device according to an embodiment of the disclosure, wherein: (1) substrate; (2) SRB layer; (3) isolation; (4) SQB layer; (5) channel layer; (7") gate metal.

In the examples of the FinFET configuration the strained quantum barrier layer (4) may be positioned within about 10 nm below the lowest part of the gate electrode (7").

Further in the embodiments of the FinFET configuration the channel layer has a thickness of about 10 nm to 50 nm.

In a second aspect a method for manufacturing an n-FET transistor is described comprising:
a. Providing a patterned semiconductor substrate having a recess exposing at its bottom the semiconductor substrate and having lateral walls comprising an insulator material, followed by
b. Forming by epitaxial growth a strain-relaxed buffer SRB layer comprising Ge in the recess, then
c. forming by epitaxial growth a strained quantum barrier SQB layer which is overlying and in contact with the strain-relaxed buffer layer and comprises SiGe, followed by
d. forming by epitaxial growth a channel layer which is overlying and in contact with the strained quantum barrier layer, wherein the channel layer comprises Ge,
e. wherein the compositions of the strain-relaxed buffer layer, the strained quantum barrier layer and the channel layer are chosen such that between the strained quantum barrier layer and the channel layer there is a lattice constant mismatch of at least about 0.4%.

In one embodiment, the strain-relaxed buffer layer is grown epitaxial in the recess thereby filling completely and overgrowing the initial recess. Then, well implantation can be performed. Subsequently, the strain-relaxed buffer is partially recessed back (etched back) before forming the strained quantum barrier layer, such that a second recess is left having a smaller depth than the initial recess. The SRB is thus filling only partially the initial recess and after growing the SQB layer and the channel layer the initial recess is filled up completely again.

In one embodiment, the strained quantum barrier layer and the channel layer are grown epitaxial in-situ (without vacuum break) in an epitaxial reactor. The process of etching back the SRB layer may be performed in-situ in the epitaxial reactor, immediately before growing the SQB layer.

In one embodiment, the strain-relaxed buffer layer, the quantum barrier layer and the channel layer may comprise dopants introduced either during the epitaxial growth by in-situ doping or by implantation after the epitaxial growth.

In a specific example an nFET transistor is described comprising a Si substrate, a SRB layer on the Si substrate and a channel layer, wherein both the SRB layer and the channel layer are comprising Ge and may comprise dopants. Further the transistor comprises a SQB layer sandwiched in between the SRB layer and the channel layer and in physical contact with both. The SQB layer is contains SiGe (with about 75 at % Ge) and may further contain dopants. The device of this example has the benefit of the reduced junction leakage due to the presence higher band gap of the SQB layer.

In another specific example an nFET transistor is described comprising a Si substrate, a SRB layer on the Si substrate comprising GeSn with up to about 10 at % Sn and which may comprise further dopants. Further the transistor comprises a channel layer comprising GeSn (Sn<about 10 at %) or SiGe (Ge>about 75 at %) and may comprise dopants. Further, the transistor comprises a SQB layer sandwiched in between the SRB layer and the channel layer and in physical contact with both. The SQB layer contains SiGe (with about 60-70 at % Ge) and may further contain dopants. The device of this example has the benefit of the reduced junction leakage due to the presence of the SQB layer. Additionally, the transistor has the benefit of enhanced mobility and, consequently, higher ON-current due to the tensile strain present in the channel.

In embodiments of the first and second aspect of the disclosure the following inventive features are disclosed:

An n-FET transistor comprising a semiconductor substrate, a strain-relaxed buffer layer comprising Ge, a strained quantum barrier layer comprising SiGe and a channel layer comprising Ge, wherein the strained quantum barrier layer is positioned in between the strain relaxed buffer layer and the channel layer and in physical contact with both, and wherein the compositions of the strain-relaxed buffer layer, the strained quantum barrier layer and the channel layer are chosen such that between the strained quantum barrier layer and the channel layer there is a lattice constant mismatch of at least about 0.4%.

The n-FET transistor of the above, wherein each of the strain-relaxed buffer layer and the channel layer has a Ge concentration higher than or equal to about 75 at %.

The n-FET transistor of any of the above, wherein the strain-relaxed buffer layer and/or the channel layer further comprises Si.

The n-FET transistor of any of the above, wherein the strain-relaxed buffer layer and/or the channel layer further comprises Sn.

The n-FET transistor of the above, wherein the Sn concentration is lower than about 10 at %.

The n-FET transistor of any of the above, wherein the quantum barrier layer comprises SiGe with a Ge concentration between about 50 at % to 90 at %, particularly between about 60 at % to 80 at %, more particularly between about 65 at % and 75 at %.

The n-FET transistor of the above, wherein the strained quantum barrier layer has a thickness of about 3 nm to 30 nm.

The n-FET transistor of any of the above, wherein one of more of the strain-relaxed buffer, the quantum barrier layer and the channel layer comprises dopants.

The n-FET transistor of any of the above, further comprising elevated source and drain areas comprising Ge or SiGe with a Si concentration lower than the Si concentration of the strain-relaxed buffer.

The n-FET transistor of any of the above, wherein the strain-relaxed buffer layer comprises a plurality of sub-layers and/or wherein the strain-relaxed buffer has a gradient in Ge concentration with the lowest Ge concentration at the interface with the substrate.

The n-FET transistor of any of the above, wherein the transistor has a planar configuration.

The n-FET transistor of the above, wherein the channel layer has a thickness of about 3 nm to 20 nm.

The n-FET transistor of the above, wherein the transistor has a FinFET configuration.

The n-FET transistor of the above, wherein the transistor has a FinFET configuration and the channel layer has a thickness of about 10 nm to 50 nm.

A method for manufacturing an n-FET transistor comprises a) providing a patterned semiconductor substrate having a recess exposing at its bottom the semiconductor substrate and having lateral walls comprising an insulator material, b) forming by epitaxial growth a strain-relaxed buffer layer comprising Ge in the recess, followed by c) forming by epitaxial growth a strained quantum barrier layer which is overlying and in contact with the strain-relaxed buffer layer and comprises SiGe, followed by d) forming by epitaxial growth a channel layer which is overlying and in contact with the strained quantum barrier layer and comprises Ge, wherein the compositions of the strain-relaxed buffer layer, the strained quantum barrier layer and the channel layer are chosen such that between the strained quantum barrier layer and the channel layer there is a lattice constant mismatch of at least about 0.4%.

The method of the above, wherein at process (b) the strain-relaxed buffer layer completely fills and overgrows the recess and it is then partially etched back to create a second recess before forming the strained quantum layer.

The method of the above, wherein each of the strain-relaxed buffer layer and the channel layer have a Ge concentration higher than or equal to about 75 at %.

The method of the above, wherein at least one of the strain-relaxed buffer layer and the channel layer further comprises Si.

The method of the above, wherein at least one of the strain-relaxed buffer layer and the channel layer further comprises Sn.

The method of the above, wherein the Sn concentration is lower than about 10 at %.

The method of the above, wherein the quantum barrier layer comprises SiGe with a Ge concentration between about 50 at % to 90 at %, particularly between about 60 at % to 80 at %, more particularly between about 65 at % and 75 at %.

The method of the above, wherein one or more of the strain-relaxed buffer, the quantum barrier layer and the channel layer comprises dopants introduced during the epitaxial growth by in-situ doping or by implantation after the epitaxial growth.

The method of the above, wherein the strain-relaxed buffer layer comprises a plurality of sub-layers and/or wherein the strain-relaxed buffer has a gradient in Ge concentration with the lowest Ge concentration at the interface with the substrate.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention.

What is claimed is:

1. A FinFET device comprising:
   a semiconductor substrate; and
   a fin-shaped structure, comprising:
   a strain-relaxed buffer layer comprising Ge formed on the semiconductor substrate,
   a channel layer formed on the strain-relaxed buffer layer, and
   a strained quantum barrier layer comprising SiGe interposed between and in contact with the strain-relaxed buffer layer and the channel layer,
   wherein the compositions of the strain-relaxed buffer layer, the strained quantum barrier layer and the channel layer are chosen such that a band offset of the channel layer and a band offset of the strained quantum barrier layer have opposite signs with respect to the strain-relaxed buffer layer, and
   wherein the strain-relaxed buffer layer, the strained quantum barrier layer and the channel layer together form at least one of an electron-confining conduction band quantum well and a hole-confining valence band quantum well.

2. The FinFET device of claim 1 wherein the channel layer comprises Ge.

3. The FinFET device of claim 2, wherein the device is a n-type FinFET and wherein the compositions of the strain-relaxed buffer layer, the strained quantum barrier layer and the channel layer are chosen such that between the strained quantum barrier layer and the channel layer there is a lattice constant mismatch of at least about 0.4%.

4. The FinFET device of claim 2, wherein the device is a p-type FET and wherein the compositions of the strain-relaxed buffer layer, the strained quantum barrier layer and the channel layer are chosen such that the strained quantum barrier layer comprises a lower amount of Ge than the strain-relaxed buffer layer.

5. The FinFET device of claim 1, wherein the strain-relaxed buffer layer and/or the channel layer further comprises Si.

6. The FinFET device of claim 1, wherein the strain-relaxed buffer layer and/or the channel layer further comprises Sn.

7. The FinFET device of claim 1, wherein the device is an n-type FET and wherein the channel layer comprises Si.

8. The FinFET device of claim 7, wherein the compositions of the strain-relaxed buffer layer, the strained quantum barrier layer and the channel layer are chosen such that the strained quantum barrier layer comprises higher amount of Ge than the strain-relaxed buffer layer.

9. The FinFET device of claim 1, wherein the strained quantum barrier layer has a thickness of about 3 nm to 30 nm.

10. A planar FET device comprising:
    a semiconductor substrate;
    a strain-relaxed buffer layer comprising Ge formed on the semiconductor substrate;
    a channel layer comprising Ge on the strain-relaxed buffer layer; and
    a strained quantum barrier layer comprising SiGe interposed between and in contact with the strain relaxed buffer layer and the channel layer,
    wherein the compositions of the strain-relaxed buffer layer, the strained quantum barrier layer and the channel layer are chosen such that a band offset of the channel layer and a band offset of the strained quantum barrier layer have opposite signs with respect to the strain-relaxed buffer, and
    wherein the strain-relaxed buffer layer, the strained quantum barrier layer and the channel layer together form at least one of an electron-confining conduction band quantum well or a hole-confining valence band quantum well.

11. The planar FET device of claim 10, wherein the device is a n-type FET and wherein the compositions of the strain-relaxed buffer layer, the strained quantum barrier layer and the channel layer are chosen such that between the strained quantum barrier layer and the channel layer there is a lattice constant mismatch of at least about 0.4%.

12. The planar FET device of claim 10, wherein the strain-relaxed buffer layer and/or the channel layer further comprises Si.

13. The planar FET device of claim 10, wherein the strain-relaxed buffer layer and/or the channel layer further comprises Sn.

14. The planar FET device of claim 10, wherein the device is a p-type FET and wherein the compositions of the strain-relaxed buffer layer, the strained quantum barrier layer and the channel layer are chosen such that the strained quantum barrier layer comprises a lower amount of Ge than the strain relaxed buffer layer.

15. The planar FET device of claim 10, wherein the strained quantum barrier layer has a thickness of about 3 nm to 30 nm.

* * * * *

UNITED STATES PATENT AND TRADEMARK OFFICE
CERTIFICATE OF CORRECTION

PATENT NO. : 9,006,705 B2  
APPLICATION NO. : 13/914514  
DATED : April 14, 2015  
INVENTOR(S) : Geert Eneman et al.

Page 1 of 1

It is certified that error appears in the above-identified patent and that said Letters Patent is hereby corrected as shown below:

IN THE SPECIFICATION

In column 2 at line 42, Change "FIG. 4." to --FIG. 4--.

In column 2 at line 49, Change "FIG. 5." to --FIG. 5--.

In column 3 at line 47, After "tensor" insert -- $\epsilon'$ --.

Signed and Sealed this  
Twenty-third Day of February, 2016

Michelle K. Lee  
*Director of the United States Patent and Trademark Office*